United States Patent
Matsuda et al.

[11] Patent Number: 6,092,542
[45] Date of Patent: Jul. 25, 2000

[54] CLEANING APPARATUS

[75] Inventors: Naoki Matsuda, Yokohama; Yoshiyuki Ohta, Sagamihara; Kenya Ito, Fujisawa; Takahiro Nanjo, Yokohama, all of Japan

[73] Assignee: Ebara Corporation, Tokyo, Japan

[21] Appl. No.: 09/276,920

[22] Filed: Mar. 26, 1999

[30] Foreign Application Priority Data

Mar. 30, 1998 [JP] Japan .................................. 10-103705

[51] Int. Cl.[7] ...................................................... B08B 3/02
[52] U.S. Cl. .......................... 134/153; 134/157; 134/172; 134/902; 134/198; 118/321; 239/264
[58] Field of Search ..................................... 134/153, 157, 134/902, 184, 186, 172; 118/323, 321; 239/264, 265, 227, 198

[56] References Cited

U.S. PATENT DOCUMENTS 4,326,553   4/1982   Hall ............................................ 134/53
5,718,763   2/1998   Tateyama et al. ......................... 118/52
5,762,708   6/1998   Motoda et al. ............................ 118/52

FOREIGN PATENT DOCUMENTS 7-74134   3/1995   Japan .

*Primary Examiner*—Frankie L. Stinson
*Attorney, Agent, or Firm*—Wenderoth, Lind & Ponack, L.L.P.

[57] ABSTRACT

A cleaning apparatus is used for cleaning a substrate such as a semiconductor wafer, a glass substrate, or a liquid crystal panel with a cleaning member. The cleaning apparatus includes: a holding mechanism for holding a workpiece, an arm movable relative to the workpiece, a cleaning member mounted on the arm for cleaning the workpiece held by the holding mechanism, a moving mechanism for vertically moving the cleaning member with respect to the workpiece held by the holding mechanism, and a controller for controlling the moving mechanism to adjust the cleaning member to a setting height.

5 Claims, 4 Drawing Sheets

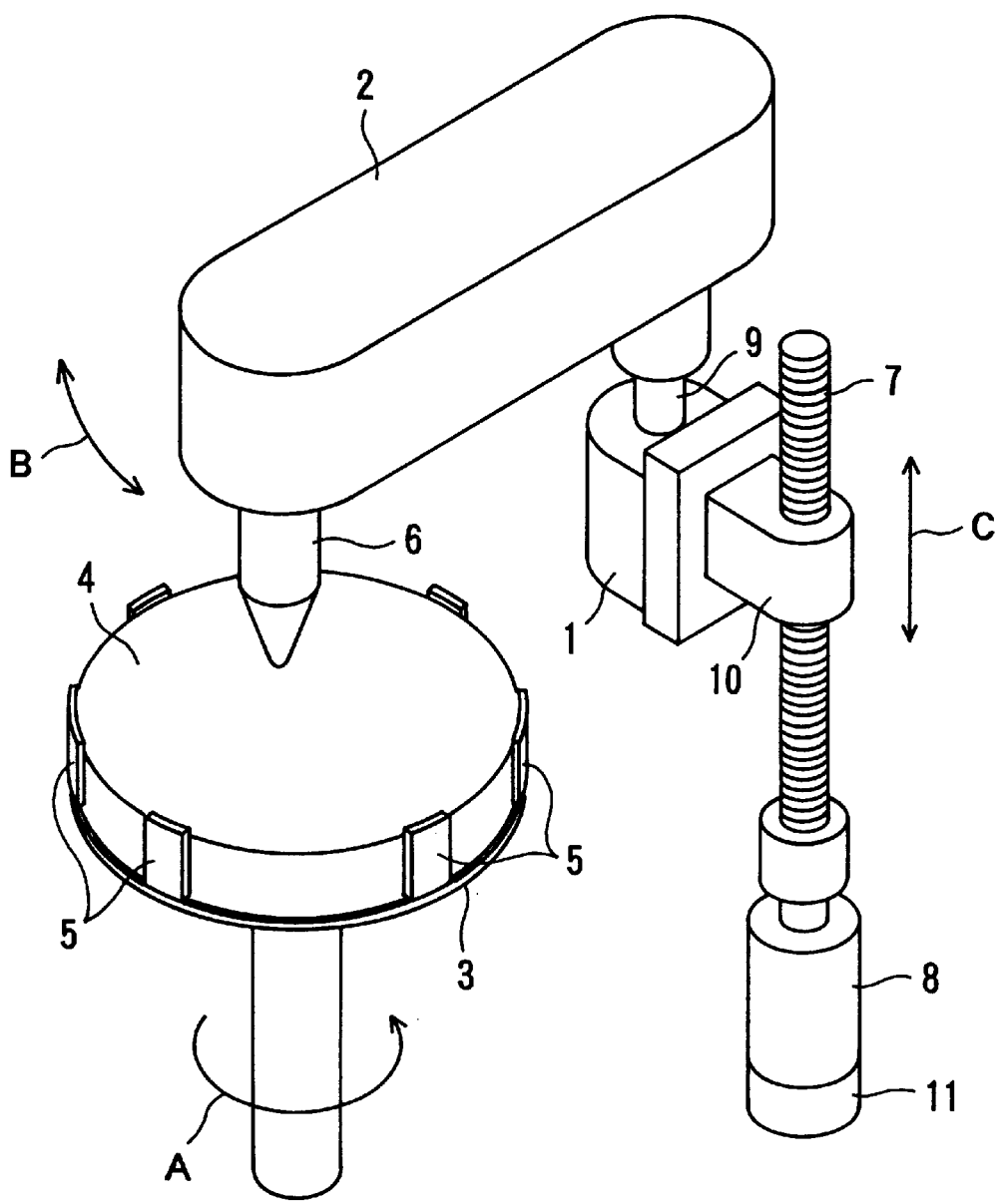
F I G. 1

CLEANING APPARATUS

BACKGROUND OF THE INVENTION

1. Field of the Invention

The present invention relates to a cleaning apparatus for cleaning a substrate such as a semiconductor wafer, a glass substrate, or a liquid crystal panel with a cleaning member.

2. Description of the Related Art

As semiconductor devices become more highly integrated in recent years, circuit interconnections become thinner and the distances between those interconnections also become smaller. While processing a semiconductor substrate, particles such as minute semiconductor particles, dust particles, or small crystalline pieces tend to be attached to the semiconductor substrate. If particles existing on the semiconductor substrate are greater in size than the distances between interconnections on the semiconductor substrate, then short-circuits will possibly be developed between the interconnections. To avoid such a drawback, any particles present on the semiconductor substrate are required to be sufficiently smaller than the distances between interconnections on the semiconductor substrate. This holds true for the processing of other substrates including a glass substrate for use as a photomask, a liquid crystal panel, etc. To meet such a requirement, there has been demand for a cleaning apparatus capable of removing smaller particles in the submicron level from semiconductor substrates and other substrates.

FIG. 4 of the accompanying drawings shows in perspective a conventional cleaning apparatus for cleaning a substrate such as a semiconductor wafer. As shown in FIG. 4, the conventional cleaning apparatus has a plurality of workpiece chucks 105 for clamping a planar workpiece 104 such as a processed semiconductor wafer. The workpiece chucks 105 are mounted at equal angular intervals on a chuck base 103 along an outer circumferential edge thereof. The conventional cleaning apparatus also has a swing arm 102 angularly movable in the directions indicated by the arrow B about a vertical axis at one of its opposite ends by a motor 101 whose output shaft is coupled to the swing arm 102. A cleaning member 106 is attached to the forward end of the swing arm 102. The motor 101 is supported on an upper end of a vertical rod of an air cylinder 107. Therefore, the swing arm 102 is vertically movable by the air cylinder 107. Vertical movement of the swing arm 102 is limited by a mechanical stopper 108 combined with the air cylinder 107.

In operation, the chuck base 103 is rotated about a vertical axis in the direction indicated by the arrow A, and the swing arm 102 is angularly moved in the directions indicated by the arrow B. The cleaning member 106 may comprise an ultrasonic nozzle, a cavitation jet nozzle, a pencil-shaped sponge member, or the like.

To be more specific, the ultrasonic nozzle ejects liquid having ultrasonic vibrational energy applied thereto, and the cavitation jet nozzle ejects high pressure liquid containing cavitation therein. If the cleaning member 106 comprises the ultrasonic nozzle or the cavitation jet nozzle, then the positional relationship between the workpiece 104 and the cleaning member 106 needs to be controlled accurately because the frequency of the ultrasonic waves and the focus of the nozzle are related to the above positional relationship for the ultrasonic nozzle or the appropriate rise and fall of cavitation are related to the above positional relationship for cavitation jet nozzle. The cleaning member 106 supported by the swing arm 102 is vertically lifted or lowered by the air cylinder 107, and can accurately be positioned at a lower stroke end thereof by the mechanical stopper 108 that is located near a lower stroke end of the air cylinder 107.

However, in the conventional apparatus, for varying the positional relationship between the workpiece 104 and the cleaning member 106, it has been necessary to interrupt the operation of the cleaning apparatus, and then manually adjust the position of the cleaning member 106 relatively to the workpiece 104. If the cleaning member 106 comprises a cavitation jet nozzle, it has suffered a problem of insufficient reproducibility in cleaning a plurality of workpieces because individual cavitation jet nozzles tend to have different characteristics and the cleaning process is greatly affected by the accuracy of the vertical position of the surface, to be cleaned, of the workpiece 104 clamped by the workpiece chucks 105.

SUMMARY OF THE INVENTION

It is therefore an object of the present invention to provide a cleaning apparatus which is capable of easily varying the vertical position of a cleaning member, and finely adjusting the vertical position of the cleaning member.

Another object of the present invention is to provide a cleaning apparatus which is capable of cleaning a plurality of workpieces to substantially the same level of cleanness regardless of different characteristics of individual cleaning members used and different vertical positions of the surfaces, to be cleaned, of clamped workpieces.

According to the present invention, there is provided a cleaning apparatus for cleaning a workpiece, comprising: a holding mechanism for holding a workpiece; an arm movable relative to the workpiece; a cleaning member mounted on the arm, for cleaning the workpiece held by the holding mechanism; a moving mechanism for vertically moving the cleaning member with respect to the workpiece held by the holding mechanism; and a controller for controlling the moving mechanism to adjust the cleaning member to a setting height.

The controller may have a function for varying stepwise the height of said cleaning member with respect to the workpiece held by said holding mechanism to clean the workpiece repeatedly at different heights of said cleaning member.

The cleaning member may comprise one of an ultrasonic nozzle for ejecting liquid having ultrasonic vibration energy applied thereto and a cavitation jet nozzle for ejecting liquid containing cavitation therein.

The above and other objects, features, and advantages of the present invention will become apparent from the following description when taken in conjunction with the acompanying drawings which illustrate a preferred embodiment of the present invention by way of example.

BRIEF DESCRIPTION OF THE DRAWINGS

FIG. 1 is a perspective view of a cleaning apparatus according to an embodiment of the present invention;

DETAILED DESCRIPTION OF THE PREFERRED EMBODIMENT

Figure 2:
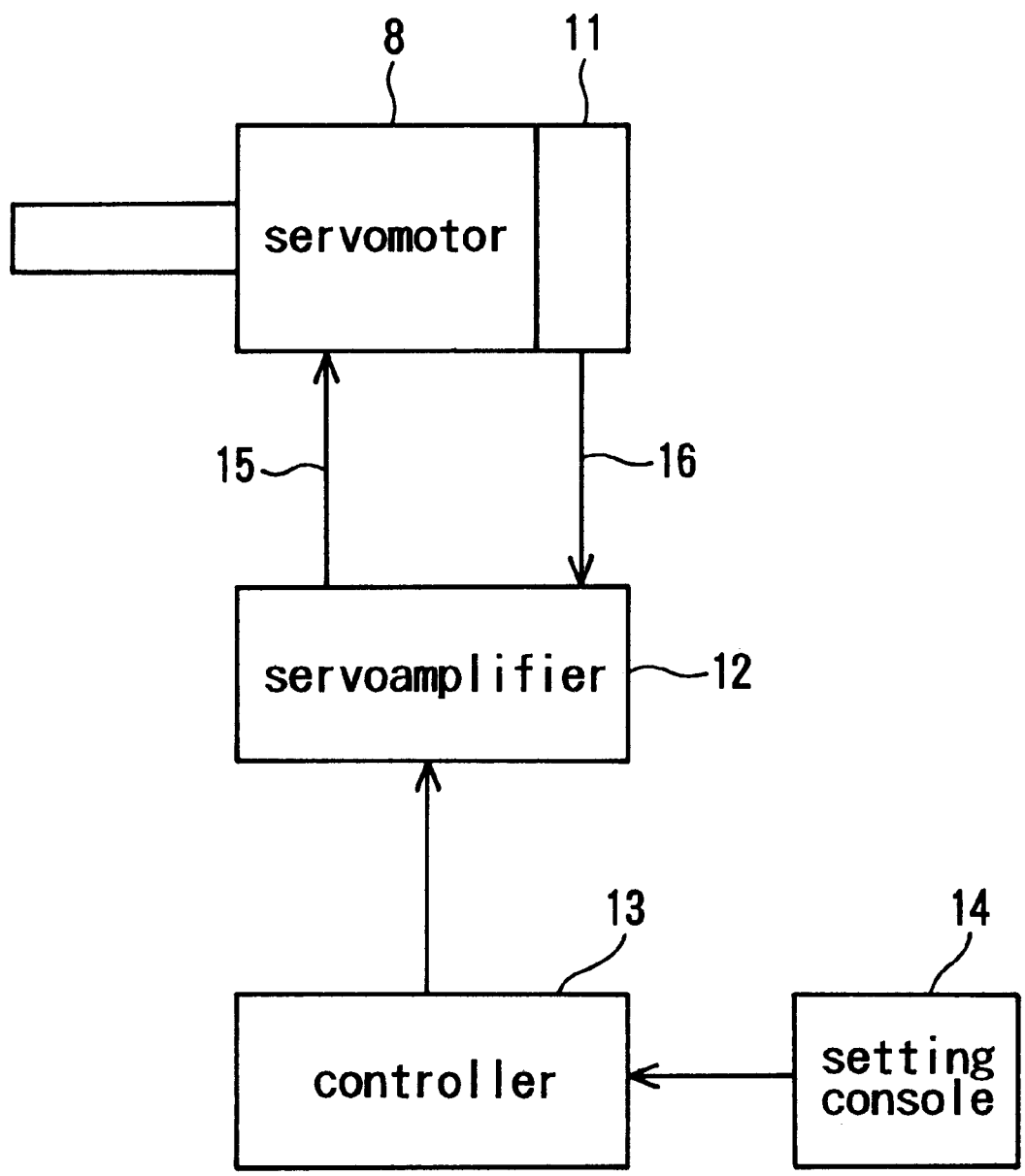
FIG. 2 is a block diagram of a control system for vertically moving a swing arm to lift and lower a cleaning member in the cleaning apparatus shown in FIG. 1.

Next, a cleaning apparatus according to an embodiment of the present invention will be described with reference to FIGS. 1 through 3.

As shown in FIG. 1, a cleaning apparatus has a plurality of workpiece chucks 5 for clamping a workpiece 4 such as a processed semiconductor wafer. The workpiece chucks 5 are mounted at equal angular intervals on a chuck base 3 along an outer circumferential edge thereof. The cleaning apparatus also has a swing arm 2 angularly movable about a vertical shaft 9 at one of its opposite ends by a motor 1 which is coaxially coupled to the vertical shaft 9. A cleaning member 6 is attached to the forward end of the swing arm 2.

The cleaning apparatus has a mechanism for vertically moving the cleaning member 6. Specifically, a vertical ball screw 7 is engaged with a bracket 10 fixed to the motor 1 and has a lower end connected to a servomotor 8. When the ball screw 7 is rotated about its own axis by the servomotor 8, the swing arm 2 is vertically moved in the directions indicated by the arrow C through the bracket 10. While the cleaning apparatus is in operation, the chuck base 3 is rotatable about a vertical axis in the direction indicated by the arrow A, and the swing arm 2 is angularly movable in the directions indicated by the arrow B.

FIG. 2 shows in block form a control system for vertically moving the swing arm 2 to lift and lower the cleaning member 6. As shown in FIG. 2, the control system includes a servomotor 8 associated with a rotary encoder 11 (see also FIG. 1) for detecting an angular displacement of the servomotor 8, a servoamplifier 12, a controller 13, and a setting console 14. The setting console 14 allows the operator to manually set a vertical position of the cleaning member 6 and other parameters. When a desired vertical position of the cleaning member 6 is set in the setting console 14, the setting console 14 sends a signal indicative of the set vertical position to the controller 13. Based on the supplied signal, the controller 13 calculates an angular displacement to be made by the servomotor 8 so as to achieve the desired vertical position of the cleaning member 6. The controller 13 then controls the servoamplifier 12 to transmit a power signal indicative of the calculated angular displacement via a power signal line 15 to the servomotor 8. The servomotor 8 makes the calculated angular displacement, which brings the cleaning member 6 to the desired vertical position. The angular displacement of the servomotor 8 is detected by the rotary encoder 11, which sends a signal indicative of the detected angular displacement via a feedback signal line 16 to the servoamplifier 12. Therefore, the cleaning member 6 can be positioned accurately to the desired vertical position which has been set in the setting console 14.

When the servomotor 8 makes the calculated angular displacement, the ball screw 7 is rotated about its own axis to lift or lower the bracket 10 for thereby causing the swing arm 2 to lift or lower the cleaning member 6. In this manner, the vertical height of the cleaning member 6 is positioned accurately in the desired vertical position which has been set in the setting console 14 by the operator.

While the workpiece 4 is being cleaned, the controller 13 is capable of varying stepwise the vertical position of the cleaning member 6 in synchronization with angular movement of the swing arm 2, so that the workpiece 4 can be cleaned repeatedly at the different vertical positions of the cleaning member 6. This control function of the controller 13 allows the cleaning apparatus to clean a plurality of workpieces to substantially the same level of cleanness regardless of different characteristics of individual cleaning members 6 used and different vertical positions of the surfaces, to be cleaned, of the workpieces 4 clamped by the workpiece chucks 5.

Figure 3:
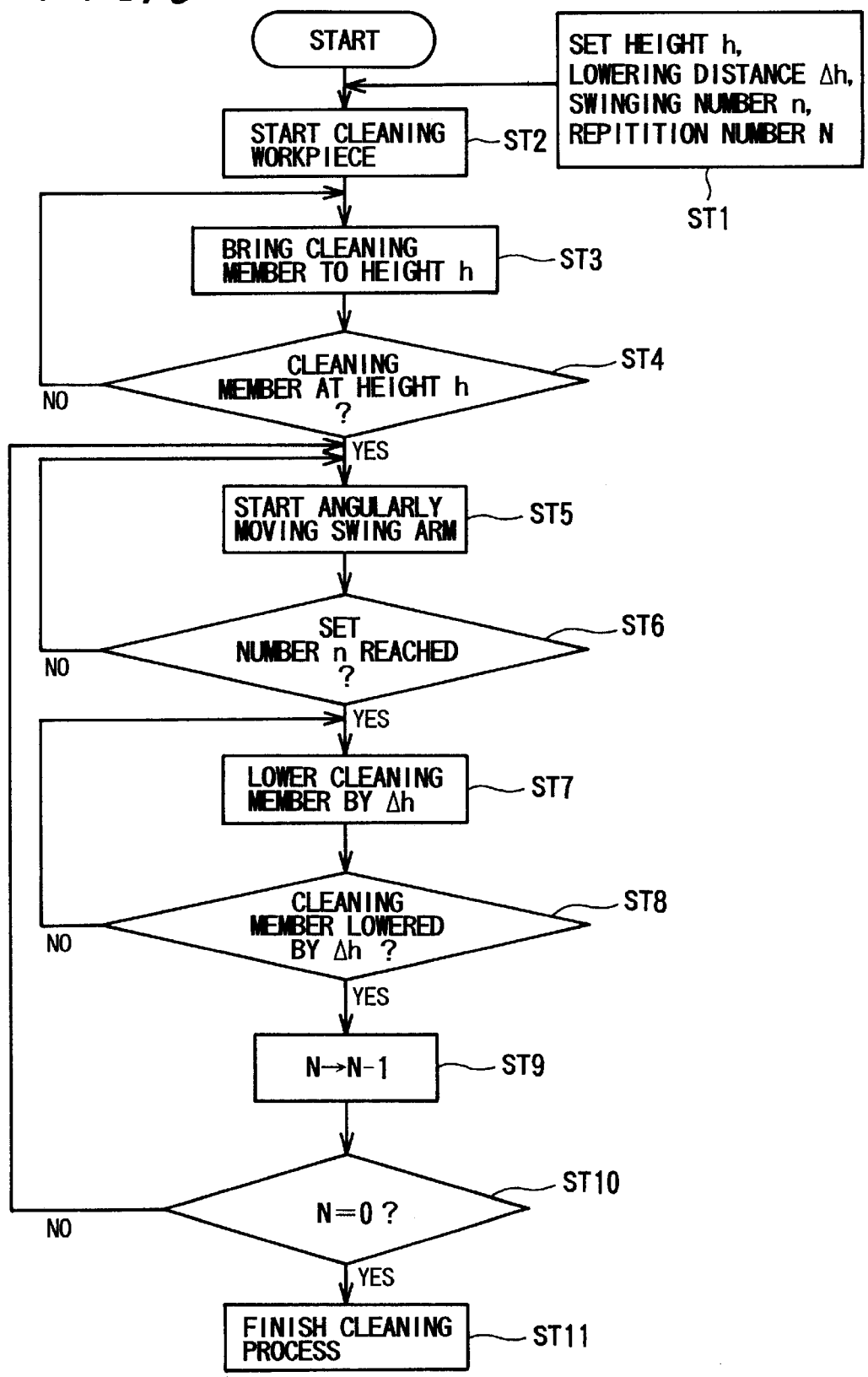
FIG. 3 is a flowchart of a control sequence performed by the control system shown in FIG. 2 for varying stepwise the vertical position of the cleaning member in synchronization with swinging movement of the swing arm.
Figure 4:
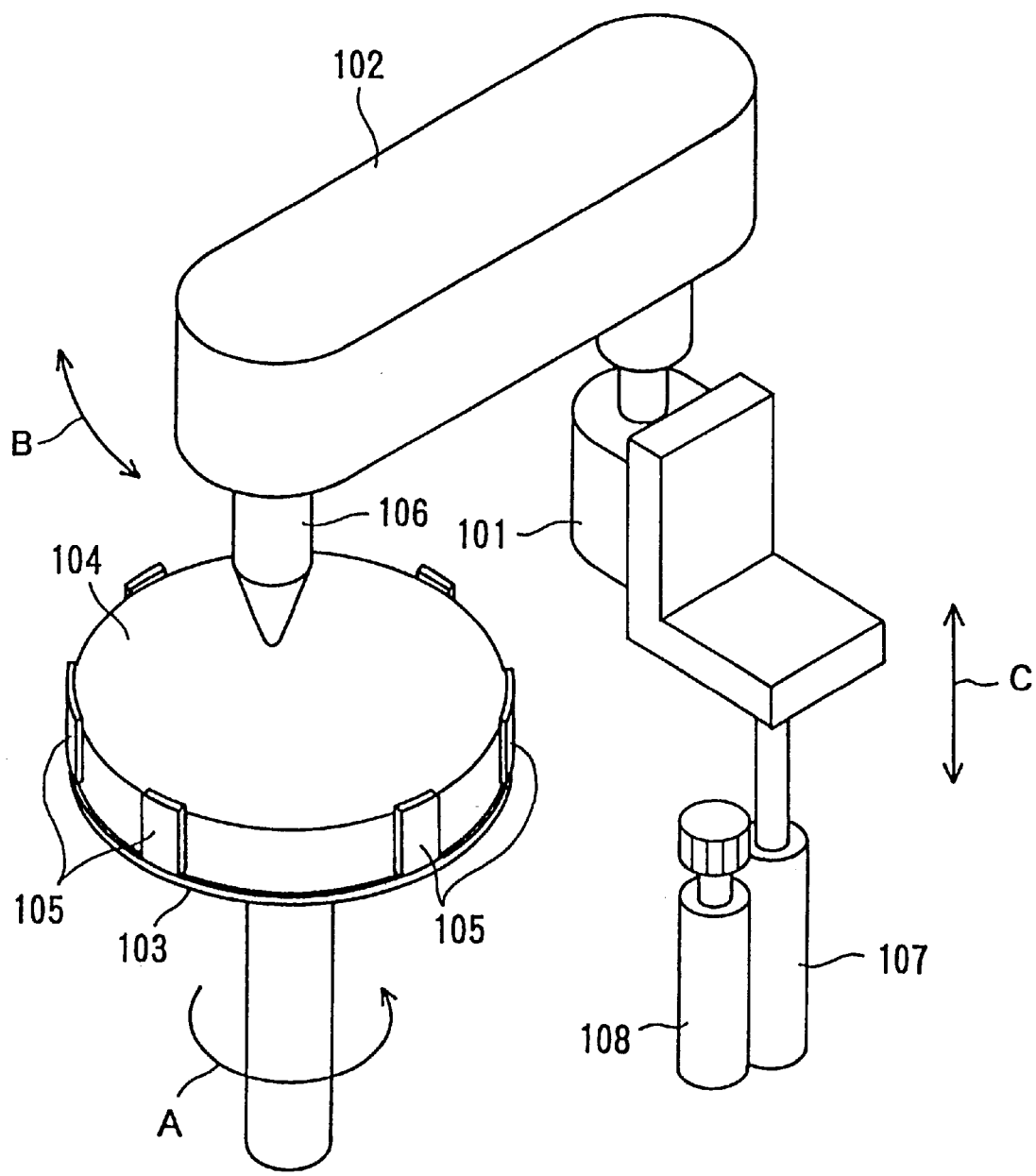
FIG. 4 is a perspective view of a conventional cleaning apparatus.

FIG. 3 shows a control sequence performed by the control system shown in FIG. 2 for varying stepwise the vertical position of the cleaning member 6 in synchronization with swinging movement of the swing arm 2. Successive steps of the control sequence shown in FIG. 3 will be described below.

In the setting console 14, a vertical position or height h of the cleaning member 6 at the start of a cleaning process, a lowering distance Δh that the cleaning member 6 is to be slightly lowered, the number n of times that the swing arm 2 is to be angularly moved until the cleaning member 6 is to be slightly lowered once, and the number N of times that the cleaning member 6 is to be slightly lowered repeatedly, i.e., the number N of times that the height of the cleaning member 6 is to be varied stepwise are set, in step ST1.

Then, the cleaning member 6 starts cleaning the workpiece 4 in step ST2. At this time, the workpiece 4 clamped by the workpiece chucks 5 is rotated. The cleaning member 6 is set to the height h in step ST3. Then, after it is confirmed that the cleaning member 6 is positioned at the height h in step ST4, the swing arm 2 starts to be angularly moved in step ST5. Whether the number of times that the swing arm 2 has been angularly moved has reached the set number n or not is judged in step ST6. If the number of times that the swing arm 2 has been angularly moved has reached the set number n, then the cleaning member 6 is lowered by the set lowering distance Δh in step ST7. After it is confirmed that the cleaning member 6 has been lowered by the set lowering distance Δh in step ST8, the set number N is changed to (N+1) in step ST9. Thereafter, whether the set number N has reached N=0 or not, i.e., whether the number of times that the cleaning member 6 has been lowered by the lowering distance Δh has reached the set number N or not is judged, in step ST10. If the number of times that the cleaning member 6 has been slightly lowered has not yet reached the set number N, then control step returns to step ST5. If the number of times that the cleaning member 6 has been slightly lowered has reached the set number N, then the control sequence shown in FIG. 3 is finished, in step ST11.

Since the height or vertical position of the cleaning member 6 with respect to the workpiece 4 can be established simply in the setting console 14 which can be manually operated by the operator, positioning of the cleaning member 6 or varying of the positioning of the cleaning member 6 can be easily performed, without interrupting the operation of the cleaning apparatus and setting the position of the cleaning member 6 manually.

Because the controller 13 has the control function to vary stepwise, i.e., lower stepwise the height of the cleaning member 6 in synchronization with angular movement of the swing arm 2, while the workpiece 4 is being cleaned, the cleaning apparatus is capable of cleaning a plurality of workpieces to substantially the same level of cleanness regardless of different characteristics of individual cleaning members 6 used and different vertical positions of the surfaces, to be cleaned, of the workpieces 4 clamped by the workpiece chucks 5. Thus, the reproducibility of cleaning effects is improved greatly.

In the illustrated mechanism for vertically moving the cleaning member 6, the servomotor 8 rotates the ball screw 7 to lift or lower the swing arm 2 for thereby lifting or lowering the cleaning member 6. However, the cleaning apparatus may employ any of various other mechanisms capable of vertically moving the cleaning member 6 by a distance depending on a setting of the setting console 14.

Alternatively, the cleaning apparatus may employ a mechanism for vertically moving the cleaning member 6 with respect to the swing arm 2.

The principles of the present invention are not limited to the illustrated cleaning apparatus for cleaning a workpiece such as a semiconductor wafer, but are also applicable to a workpiece processing apparatus for processing a workpiece such as a semiconductor wafer before or after the workpiece is cleaned, e.g., for rotating the chuck base 3 at a high speed to dry the workpiece 4 in a spinning drying process.

The cleaning member 6 may comprise an ultrasonic nozzle, a cavitation jet nozzle, a pencil-shaped sponge member, or the like. Since the cleaning apparatus can control the vertical position of the cleaning member 6 with respect to the workpiece 4 highly accurately, the principles of the present invention are particularly suitable for the cleaning member 6 comprising an ultrasonic nozzle or a cavitation jet nozzle which requires the positional relationship between the workpiece 4 and the cleaning member 6 to be strictly or accurately controlled.

As is apparent from the above description, the present invention offers the following advantages:

1) The positional relationship between the substrate and the cleaning member can be accurately controlled, and work for varying the height of the cleaning member becomes extremely easy.

2) Because the controller has the control function to vary stepwise, i.e., lower stepwise the height of the cleaning member in synchronization with angular movement of the swing arm, while the workpiece is being cleaned, the cleaning apparatus is capable of cleaning a plurality of workpieces to substantially the same level of cleanness regardless of different characteristics of individual cleaning members used and different vertical positions of the surfaces, to be cleaned, of the workpieces clamped by the workpiece chucks. Thus, the reproducibility of cleaning effects is improved greatly.

Although a certain preferred embodiment of the present invention has been shown and described in detail, it should be understood that various changes and modifications may be made therein without departing from the scope of the appended claims.

What is claimed is:

1. A cleaning apparatus for cleaning a workpiece, said apparatus comprising:
    a holding mechanism for holding a workpiece;
    an arm movable relative to the workpiece;
    a cleaning member mounted on said arm, for cleaning the workpiece held by said holding mechanism;
    a moving mechanism for vertically moving said cleaning member with respect to the workpiece held by said holding mechanism; and
    a controller for controlling said moving mechanism to adjust said cleaning member to a setting height by varying stepwise the height of said cleaning member with respect to the workpiece held by said holding mechanism to clean the workpiece repeatedly at different heights of said cleaning member.

2. A cleaning apparatus according to claim 1, wherein said cleaning member comprises one of an ultrasonic nozzle for ejecting liquid having ultrasonic vibration energy applied thereto and a cavitation jet nozzle for ejecting liquid containing cavitation therein.

3. A cleaning apparatus according to claim 1, wherein said arm is angularly movable about an axis so that said cleaning member is moved horizontally above the workpiece.

4. A cleaning apparatus according to claim 1, wherein said setting height is set in a setting console.

5. A cleaning apparatus according to claim 1, wherein said moving mechanism comprises a ball screw mechanism.

* * * * *